(12) United States Patent
Tollis et al.

(10) Patent No.: US 11,551,892 B2
(45) Date of Patent: Jan. 10, 2023

(54) DUAL ROTATION SWITCHES

(71) Applicant: Continental Automotive Systems Inc., Auburn Hills, MI (US)

(72) Inventors: Daniel Pasquate Tollis, Novi, MI (US); Michael Eugene Carrel, Northville, MI (US); Jason Todd Renaud, Oxford, MI (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 549 days.

(21) Appl. No.: 16/599,627

(22) Filed: Oct. 11, 2019

(65) Prior Publication Data

US 2021/0110983 A1 Apr. 15, 2021

(51) Int. Cl.
*H01H 19/14* (2006.01)
*G06F 3/0362* (2013.01)

(52) U.S. Cl.
CPC .......... *H01H 19/14* (2013.01); *G06F 3/0362* (2013.01); *B60K 2370/126* (2019.05)

(58) Field of Classification Search
CPC .. H01H 19/14; G06F 3/0362; B60K 2370/126
See application file for complete search history.

(56) References Cited

U.S. PATENT DOCUMENTS

| | | | | |
|---|---|---|---|---|
| 6,072,139 A * | 6/2000 | Nakase | .................. | H01H 23/12 200/558 |
| 9,637,029 B2 * | 5/2017 | Benjamin | .............. | B60N 2/168 |
| 9,646,783 B1 * | 5/2017 | Stoufer | .................... | G05G 1/08 |
| 2003/0151594 A1 * | 8/2003 | Tsai | ..................... | H01H 25/008 345/163 |
| 2010/0085306 A1 * | 4/2010 | Wu | ........................ | G06F 3/0362 345/163 |
| 2010/0156792 A1 * | 6/2010 | Chou | ..................... | G06F 3/0362 345/163 |
| 2010/0262929 A1 * | 10/2010 | Avery | ................... | G06F 3/0488 345/173 |
| 2011/0301818 A1 * | 12/2011 | Hamade | .................. | F16H 59/08 701/51 |
| 2012/0306603 A1 * | 12/2012 | Olsson | .................. | G06F 3/0362 335/229 |
| 2016/0215534 A1 * | 7/2016 | Rudraraju | ............... | E05B 77/04 |
| 2017/0316901 A1 * | 11/2017 | Sawada | .................. | H01H 19/02 |
| 2017/0351292 A1 * | 12/2017 | Stoufer | .................... | G05G 5/04 |
| 2020/0090887 A1 * | 3/2020 | Son | ........................ | H01H 19/04 |
| 2020/0125228 A1 * | 4/2020 | Chion | .................... | G06F 3/0488 |
| 2020/0299930 A1 * | 9/2020 | Wuisan | ................. | E02F 9/2012 |
| 2021/0012985 A1 * | 1/2021 | Urayama | ............... | H01H 19/20 |
| 2021/0162866 A1 * | 6/2021 | Alu | ........................ | B60K 35/00 |
| 2021/0340725 A1 * | 11/2021 | Velde | .................... | E02F 9/2029 |
| 2022/0003618 A1 * | 1/2022 | Van Rens | .......... | A63B 22/0605 |

* cited by examiner

*Primary Examiner* — Christopher E Leiby

(57) ABSTRACT

A switch assembly according to an example of this disclosure includes a disk rotatable about a disk axis in a first circumferential direction and a second circumferential direction opposite the first circumferential direction. A U-shaped spring is fixed to the disk. Rotation of the disk in the first circumferential direction moves the disk in a first axial direction, and rotation of the disk in the second circumferential direction moves the disk in the first axial direction.

12 Claims, 4 Drawing Sheets

DUAL ROTATION SWITCHES

BACKGROUND

Switches are known for manual control of certain components or functionality, for example, such as in vehicles. Rotary switches are known switches that are operated by a rotational input from the operator.

SUMMARY

A switch assembly according to an example of this disclosure includes a disk rotatable about a disk axis in a first circumferential direction and a second circumferential direction opposite the first circumferential direction. A U-shaped spring is fixed to the disk. Rotation of the disk in the first circumferential direction moves the disk in a first axial direction, and rotation of the disk in the second circumferential direction moves the disk in the first axial direction.

In a further example of the foregoing, the switch includes a linear encoder assembly including the disk.

In a further example of any of the foregoing, the linear encoder assembly is in communication with a control device in a vehicle.

In a further example of any of the foregoing, the U-shaped spring includes a base portion and first and second leg portions extending from the base portion. The first and second leg portions are fixed to the disk.

In a further example of any of the foregoing, the switch assembly includes a cylindrical casing. The disk is received within the cylindrical casing, and the base portion is fixed to a support provided by the cylindrical casing.

In a further example of any of the foregoing, the U-shaped spring includes a base portion and first and second leg portions which extend from the base portion. The base portion is fixed to the disk.

In a further example of any of the foregoing, the switch assembly includes a cylindrical casing. The disk is received within the cylindrical casing. The first and second leg portions are fixed to a support provided by the cylindrical casing.

In a further example of any of the foregoing, a knob includes a tapered knob shaft. The tapered knob shaft is received within a slot in the disk.

In a further example of any of the foregoing, a second disk is fixed to the knob shaft.

In a further example of any of the foregoing, the switch assembly includes a rotary encoder assembly which includes the second disk.

In a further example of any of the foregoing, the rotary encoder assembly includes a circular magnetic strip.

A switch assembly according to an example of this disclosure includes a knob assembly including a tapered knob shaft. A linear encoder assembly includes a disk that has a slot that receives the knob shaft. A U-shaped spring is fixed to the disk. A rotary encoder assembly includes a second disk fixed to the knob shaft.

In a further example of the foregoing, the U-shaped spring includes a base portion and first and second leg portions extending from the base portion. The first and second leg portions are fixed to the disk.

In a further example of any of the foregoing, the linear encoder assembly and the rotary encoder assembly are in communication with one or more control devices in a vehicle.

These and other features may be best understood from the following specification and drawings, the following of which is a brief description.

DETAILED DESCRIPTION

Figure 1:
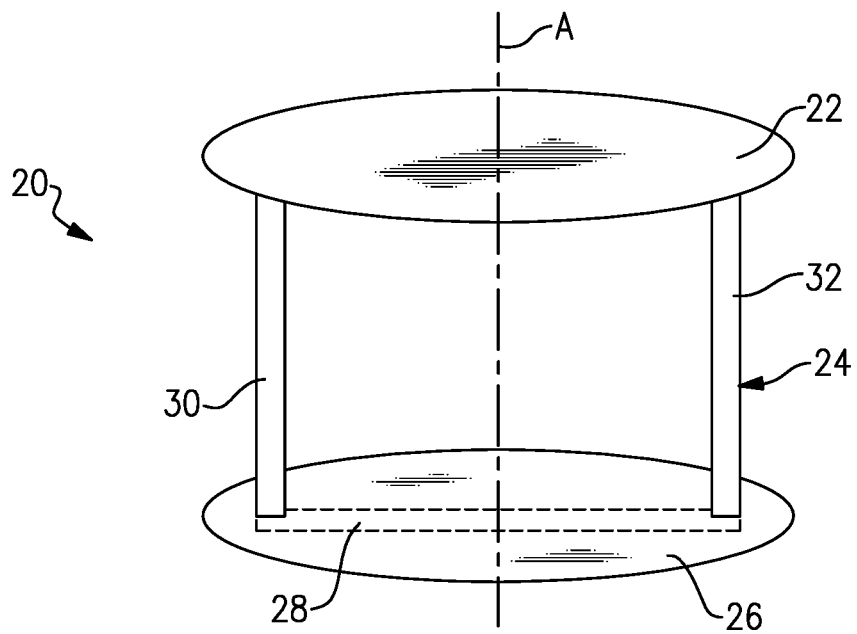
FIG. 1 schematically illustrates an example switch assembly.

FIG. 1 schematically illustrates an example switch assembly 20 including a disk 22 rotatable about a disk axis A. A U-shaped spring 24 is fixed to the disk 22 and is fixed to a support 26 axially spaced from the disk with respect to the axis A. The disk 22 is rotatable in opposing first and second circumferential directions. The example support 26 is fixed against rotation.

The example U-shaped spring 24 includes a base portion 28 and a first leg portion 30 and a second leg portion 32 extending from the base portion 28. In some examples, as shown, the base portion 28 is fixed to the support 26 and the leg portions 30, 32 are fixed to the disk 22. In some examples, the base portion 28 may be fixed to the disk 22 and the leg portions 30, 32 may be fixed to the support 26. In some examples, the U-shaped spring is fixed to the disk 22 and/or support 26 through openings in the disk 22 and/or support 26. In some examples, the U-shaped spring is fixed to the disk 22 and/or support 26 with adhesive.

Figure 2:
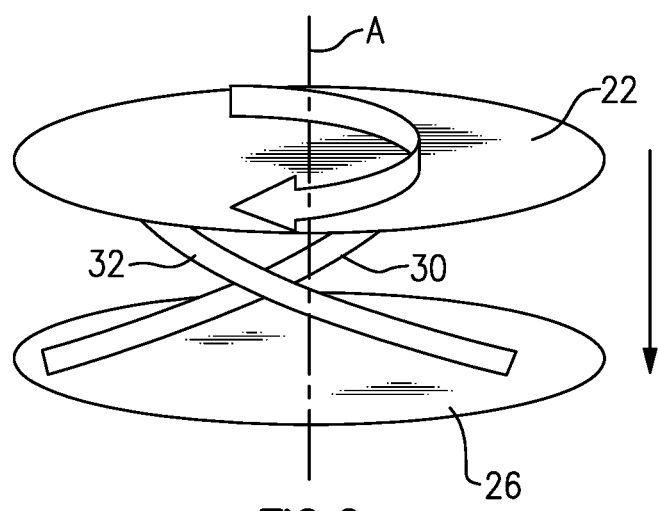
FIG. 2 schematically illustrates the example switch assembly of FIG. 1 rotated in the clockwise direction.

FIG. 2 schematically illustrates rotation of the disk 22 in the clockwise circumferential direction. This clockwise rotation causes the twisting of leg portions 30, 32 about the axis A, resulting in linear movement of the disk 22 along the axis A toward the support 26. The rotation may be the result of a manual rotational input to the disk 22. Upon removal of the rotational input, the U-shaped spring 24 biases the disk 22 to the normal position shown in FIG. 1.

Figure 3:
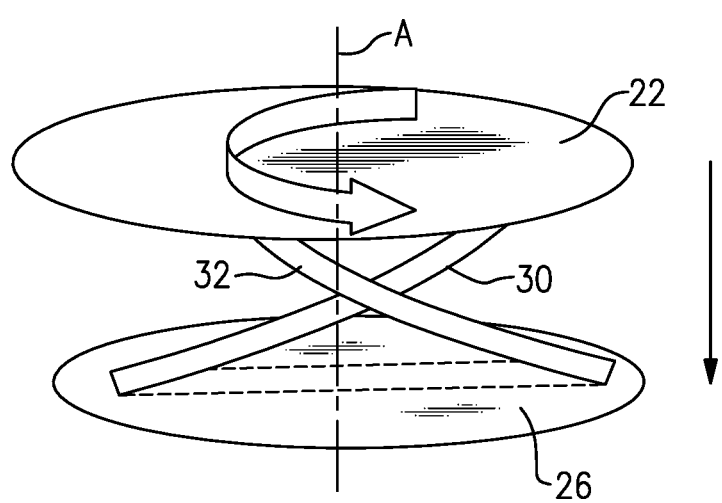
FIG. 3 schematically illustrates the example switch assembly of FIGS. 1 and 2 rotated in the counter-clockwise direction.

FIG. 3 schematically illustrates rotation of the disk 22 in the counter-clockwise circumferential direction. This counter-clockwise rotation causes the twisting of leg portions 30, 32 about the axis A, resulting in linear movement of the disk 22 along the axis A toward the support 26. The rotation may be the result of a manual rotational input to the disk 22. Upon removal of the rotational input, the U-shaped spring 24 biases the disk 22 to the normal position shown in FIG. 1.

In some examples, the rotational movement maybe be used for one signal generation, and the linear movement may be used for a second, different, signal, such as through use of rotary and linear encoders that move with the disk 22. In some examples, the first and second signals may be proportional.

Figure 4:
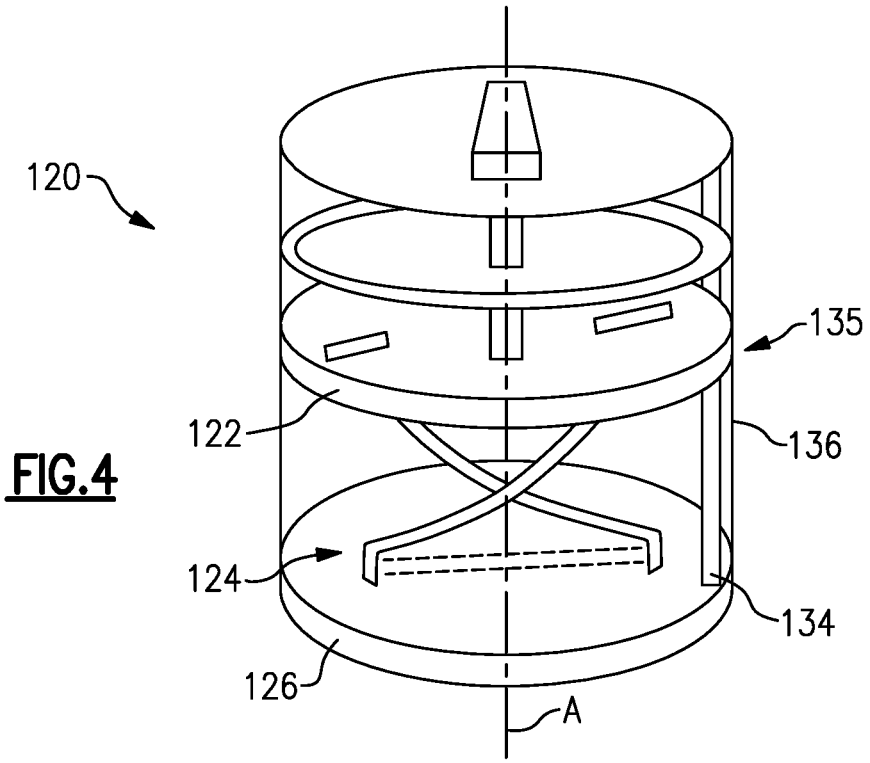
FIG. 4 illustrates a second example switch assembly.

FIG. 4 illustrates another example switch assembly 120 in a rotated position. It should be understood that like reference numerals identify corresponding or similar elements throughout the several drawings. In some examples, as shown, the switch assembly 120 is housed by a cylindrical casing 136. In some examples, as shown, the disk 122 interacts with a magnetic strip 134 on or within the casing 136 to form a linear encoder assembly 135 for signal generation of the linear position of the disk 122 along the axis A. In some examples, as shown, the casing 136 provides the support 126 to which the U-Shaped spring 124 is fixed.

Figure 5:
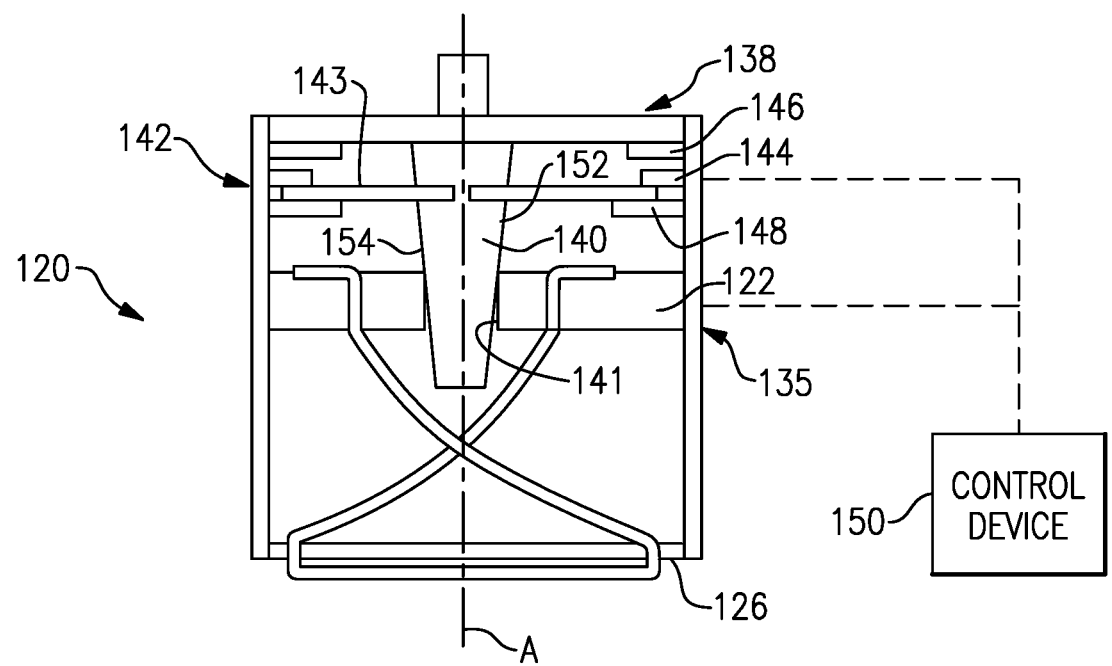
FIG. 5 illustrates a cross sectional view of the example switch assembly of FIG. 4 in a rotated position.

FIG. 5 illustrates a cross section of the example switch assembly 120 shown in FIG. 4 in the rotated position. A knob assembly 138 transfers the rotational input to the disk 122 through a knob shaft 140 received in a slot 141 in the disk 122. In some examples, as shown, the knob shaft 140 is tapered as it extends toward the support 126. The tapering allows for the disk 122 to move downward along the knob shaft 140 during rotational input to the knob assembly 138. In some examples, as shown, the tapering is provided by opposing sloped, flat surfaces 152, 154. In some examples, as shown, the knob shaft 140 has a tapered rectangular cross section. In some examples, the slot 141 may also have a taper. In some examples, with the disk 122 providing a linear encoder as shown, the downward movement of the disk 122 may generate a signal of the position of the disk 122 relative to the magnetic strip 134.

The example switch assembly 120 may further include a rotary encoder assembly 142 provided by a disk 143 fixed to the knob shaft 140 and interacting with a circular magnetic strip 144 for generation of an additional signal to that generated by the linear encoder assembly 135. In the example shown, the additional signal of the rotary encoder assembly 142 is the rotational position of the disk 143 relative to the fixed magnetic strip 144. In the example shown, the additional signal may be generated by rotation in either of the clockwise or counter-clockwise directions.

In the example shown, the knob assembly 138 is received against a shelf 146 of the casing 136. The rotary encoder 142 is received against a second shelf 148 of the casing 136. The knob assembly 138 and rotary encoder 142 therefore do not move along the axis A upon rotational input to the knob assembly 138.

As shown schematically, the linear encoder assembly 135 and the rotary encoder assembly 142 may be in communication with a control device 150. The control device 150, in some examples, may include one or more computing devices, each having one or more of a computer processor, memory, storage means, network device and input and/or output devices and/or interfaces. In some examples, the control device 150 may be a control device in a vehicle. Although shown schematically as one control device 150, the linear encoder assembly 135 and the rotary encoder assembly 142 may be in communication with the same or separate control devices. A person of ordinary skill in the art having the benefit of this disclosure would realize that other applications may benefit from this disclosure.

Figure 6:
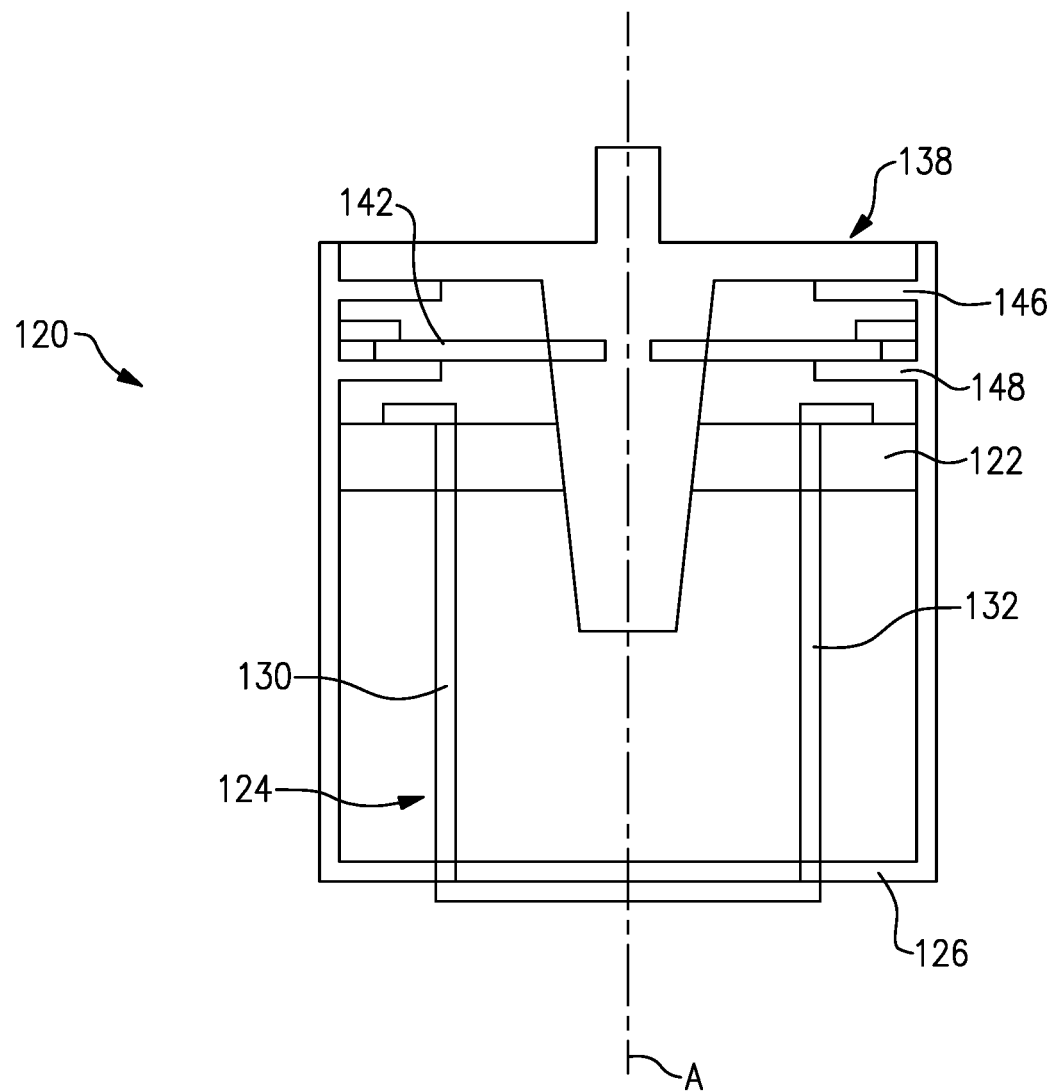
FIG. 6 illustrates a cross sectional view of the example switch assembly of FIGS. 4 and 5 in a normal position.

FIG. 6 illustrates a cross section of the example switch assembly 120 of FIGS. 4-5 in the normal position. The leg portions 130, 132 are not twisted about the axis A, and the disk 122 is farther from the support 126. The knob assembly 138 remains received against the shelf 146 and the rotary encoder assembly 142 is received against the shelf 148.

While the example encoders are disclosed as magnetic encoders, a person of ordinary skill in the art having the benefit of this disclosure would realize that other encoders, including conductive and optical encoders, may be utilized.

Although the different examples are illustrated as having specific components or steps, the examples of this disclosure are not limited to those particular combinations. It is possible to use some of the components or features from any of the examples in combination with features or components from any of the other examples.

It should be understood that although a particular component arrangement is disclosed and illustrated in these examples, other arrangements could also benefit from the teachings of this disclosure.

A worker of ordinary skill in the art would understand that certain modifications could come within the scope of this disclosure. For these reasons, the following claims should be studied to determine the true scope and content of this disclosure.

What is claimed is:

1. A switch assembly, comprising:
   a disk rotatable about a disk axis in a first circumferential direction and a second circumferential direction opposite the first circumferential direction; and
   a U-shaped spring wherein the U-shaped spring includes a base portion and first and second leg portions extending from the base portion, wherein the first and second leg portions are fixed to the disk, and wherein rotation of the disk in the first circumferential direction moves the disk in a first axial direction, and rotation of the disk in the second circumferential direction moves the disk in the first axial direction.

2. The switch assembly as recited in claim 1, comprising a linear encoder assembly including the disk.

3. The switch assembly as recited in claim 2, wherein the linear encoder assembly is in communication with a control device in a vehicle.

4. The switch assembly as recited in claim 1, comprising a cylindrical casing, wherein the disk is received within the cylindrical casing, and the base portion is fixed to a support provided by the cylindrical casing.

5. The switch assembly as recited in claim 1, wherein the base portion is fixed to the disk.

6. The switch assembly as recited in claim 5, comprising a cylindrical casing, wherein the disk is received within the cylindrical casing, and the first and second leg portions are fixed to a support provided by the cylindrical casing.

7. The switch assembly as recited in claim 1, comprising a knob including a tapered knob shaft, wherein the tapered knob shaft is received within a slot in the disk.

8. The switch assembly as recited in claim 7, comprising a second disk fixed to the knob shaft.

9. The switch assembly as recited in claim 8, comprising a rotary encoder assembly including the second disk.

10. The switch assembly as recited in claim 9, wherein the rotary encoder assembly includes a circular magnetic strip.

11. A switch assembly, comprising:
    a knob assembly including a tapered knob shaft;
    a linear encoder assembly including a disk having a slot that receives the knob shaft;
    a U-shaped spring wherein the U-shaped spring includes a base portion and first and second leg portions extending from the base portion, wherein the first and second leg portions are fixed to the disk; and
    a rotary encoder assembly including a second disk fixed to the knob shaft.

12. The switch assembly as recited in claim 11, wherein the linear encoder assembly and the rotary encoder assembly are in communication with one or more control devices in a vehicle.

* * * * *